United States Patent [19]

Blum et al.

[11] Patent Number: 4,568,632
[45] Date of Patent: Feb. 4, 1986

[54] PATTERNING OF POLYIMIDE FILMS WITH FAR ULTRAVIOLET LIGHT

[75] Inventors: Samuel E. Blum, White Plains; Karen L. Holloway, Bronx; Rangaswamy Srinivasan, Ossining, all of N.Y.

[73] Assignee: International Business Machines Corporation, Armonk, N.Y.

[21] Appl. No.: 561,445

[22] Filed: Dec. 14, 1983

Related U.S. Application Data

[63] Continuation of Ser. No. 433,303, Oct. 7, 1982, abandoned.

[51] Int. Cl.$^4$ .......................... G03C 5/00; B05D 3/06; B44C 1/22
[52] U.S. Cl. .................... 430/322; 430/297; 430/346; 430/945; 427/53.1; 427/54.1; 156/643; 250/492.1; 250/492.2
[58] Field of Search ................ 156/643; 219/121 LH, 219/121 LJ, 121 LM; 250/492.1, 492.2; 346/135.1, 76 L; 372/51; 430/297, 326, 346, 945, 322; 427/53.1, 54.1; 428/402.21, 402.22

[56] References Cited

U.S. PATENT DOCUMENTS

| | | | |
|---|---|---|---|
| 4,247,496 | 1/1981 | Kawakami et al. | 264/22 |
| 4,357,203 | 11/1982 | Zelez | 156/643 |
| 4,414,059 | 11/1983 | Blum et al. | 156/643 |
| 4,417,948 | 11/1983 | Mayne-Banton et al. | 156/643 |

OTHER PUBLICATIONS

Surinder Bahl, "Stripping Kapton Polyimide Film in Kapton Flexible Cables Using a $CO_2$ Laser", *Research Disclosure*, Sep. 1978, No. 17318, p. 23.
K. Jain et al, "Ultrafast Deep UV Lithography with Excimer Lasers", IEEE Electron Device Letters, vol. 3, EDL-3, No. 3, Mar. 1982, pp. 53-55.
S.N. 396,985, "Self Developing, Photoetching of Polyesters by Far UV Radiation", V. Mayne-Banton et al.
H. Meinhold, "Material Machining by Laser, Electron, Ind. (Germany), vol. 2, No. 3, Mar. 20, 1971.

*Primary Examiner*—John E. Kittle
*Assistant Examiner*—Cynthia Hamilton
*Attorney, Agent, or Firm*—Jackson E. Stanland

[57] ABSTRACT

A method is described for photoetching polyimides efficiently, and without the need for any chemical development steps. At least 1000Å of the polyimide are removed by irradiation of the polyimide with ultraviolet radiation having wavelengths less than 220 nm. To enhance the process, the power density of the radiation is greater than about 60 mJ/cm$^2$. The presence of an atmosphere containing oxygen enhances the etch rate, although photoetching will occur in other atmospheres.

21 Claims, 6 Drawing Figures

PATTERNING OF POLYIMIDE FILMS WITH FAR ULTRAVIOLET LIGHT

This is a continuation of application Ser. No. 433,303 filed Oct. 7, 1982 now abandoned.

TECHNICAL FIELD

This invention relates to a method for etching polyimides to a depth greater than 1000 Å, and more particularly to such a method using farultraviolet (UV) radiation of wavelengths less than 220 nm. The polyimide is photochemically etched without heating of the substrate and without degradation of the bulk of the material.

BACKGROUND ART

Polyimide films are well known polymers, and include any such polymers having an -imide linkage in the backbone or in the side chain of the polymer. These materials are commercially available under several different trade names, and are well known in the packaging of electronic circuits. These films are valued for their high thermal stability and excellent electrical properties. They have high heat resistance, good dielectric properties, are solvent-resistive, and can be applied by simple processing. While they are often used in molding and composite industries, the electronics industry uses them extensively as thin films.

Although polyimides have many attractive properties, it is very difficult to pattern films of polyimides, because they are not easily etched or dissolved away by the usual techniques. Thus, wet chemical processing is extremely difficult. In the art, reactive ion etching has been known as a technique for patterning polyimide films. However, this is a very slow process in which reactive ions, such as $CF^+_3$, react with the polyimide. This is a mechanical process in which these reactive ions are brought to the surface of the polyimide.

Since thin films of polyimide are extremely useful, it would be a distinct advantage to have a reliable technique for patterning these films. In particular, it is desirable to have a process which will provide high resolution patterning of films of polyimide. In the present invention, such a technique is described, where the polyimide is controllably photoetched by far UV radiation of wavelengths less than 220 nm, to produce patterns therein. The depth of the etching is at least 1000 Å, and can be entirely through the polyimide film.

Copending application Ser. No. 396,985 to Mayne-Banton and Srinivasan, assigned to the same assignee as the present application, describes a method for photoetching polyesters such as mylar (a trademark of DuPont) using far UV radiation of wavelengths less than 220 nm.

As is apparent to chemists, materials such as polyimide and mylar differ extensively, both in their structure and in their uses. For example, mylar is used in tapes and disks and as insulation for capacitors. Thus, mylar need not be patterned, but is often roughened to provide usefulness as a tape material. On the other hand, polyimides are used extensively in packaging and other applications where fine patterning is essential. It is quite pointless to merely provide roughening of the surface of a polyimide.

While far UV radiation of the same wavelength range has been used to photoetch mylar and polyimides, many of the effects seen are quite different. For example, far-UV radiation on mylar in a vacuum or nitrogen atmosphere will cause rapid etching of mylar when laser pulse radiation is used. However, only slow etching of mylar will occur when mercury lamps are used as a radiation source, such radiation also producing degradation of the film (cross-linking, hardening, and yellowing). In contrast with this, polyimides are nearly inert to exposure to radiation from mercury lamps in a vacuum or nitrogen atmosphere. They are also nearly inert to laser radiation under these same conditions.

Another distinction between polyesters and polyimide occurs when mercury lamp far-UV radiation is used for etching in an atmosphere of air. In air, mylar etched about 10-fold faster than in vacuum or nitrogen. On the other hand, polyimide exhibited very slow etching (about 1/6 that of mylar) at room temperatures in air. This rate increased 6-fold on heating the polyimide to 200°.

Still another distinction occurs when films of mylar and polyimides are subjected to far-UV radiation from an ArF excimer laser (193 nm) at intensities greater than 30 mJ/cm². Mylar etches at the rate of 1500 Å/pulse when a 350 mJ/cm² pulse is used. In contrast with this, polyimide etched at the rate of 750 Å pulse only at comparable light intensity. An increase in temperature had no measurable effect on the polyimide etching.

As noted previously, the structure of polyesters is much different than that of polyimides. The mylar chain is very simple, as shown here:

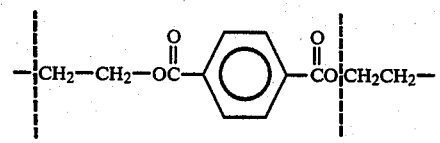

This chain is simple enough that one break is sufficient to split it. Two breaks are enough to dislodge a small molecule. It is for this reason that mylar is highly responsive for far-UV radiation.

A representative polyimide is given by the following formula:

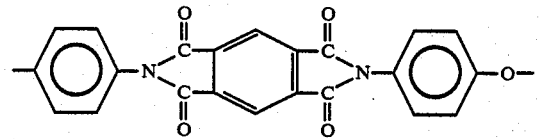

All polyimides carry the functionality

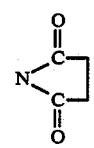

as an imide group. In the representative polyimide shown, the fused nature of the rings require that if a single bond is broken by the UV radiation, it most likely will not split the polyimide chain. Many more bond breaks are necessary to break up the chains sufficiently to dislodge a piece. Also, the polyimide is characterized by a higher percentage of carbon to hydrogen than is a polyester, such as mylar.

A general reason why polyimides are not, and would not be expected to be as affected by far-UV radiation as mylar may be the extraordinary thermal stability of the polyimides. A photon which breaks a bond in a polymer chain will also heat the polymer. This heating effect may promote further scissions in a polyester, but would be ineffective in the polyimide film.

A patent generally relating to a method for treating a thin surface of a plastic material is U.S. Pat. No. 4,247,496. In this patent, the plastic material is subject to an ultraviolet light treatment, after which it is stretched. The UV light has a wavelength ranging from 180 to 400 nm, and is emitted by sources such as mercury lamps, fluorescent lamps, xenon lamps, and carbon-arc lamps. The ultraviolet light treatment causes cracking in a surface layer (50–100 Å) of the plastic. These cracks make stretching easier and leave a surface which contains widened cracks therein.

In U.S. Pat. No. 4,247,496, no photoetching is involved because it is important that only a thin surface layer be affected. That patent does not recognize that selected wavelengths of ultraviolet radiation can be used to efficiently photoetch polyimide. In fact, polyimides are not stretchable plastics and do not have linear chains which can be stretched and oriented.

Accordingly, it is a primary object of the present invention to provide a method for effectively etching polyimide.

It is another object of this invention to provide an improved method for etching polyimide, without requiring chemicals or subsequent development steps.

It is another object of the present invention to provide a technique for photoetching polyimides without requiring heating effects.

It is another object of the present invention to provide a method for etching polyimides in order to create high resolution patterns therein.

It is another object of the present invention to provide a technique for etching polyimide films using ultraviolet radiation of a specified wavelength for photodecomposing the polyimide.

It is a further object of this invention to provide a method for photoetching polyimides without the requirement for any liquid solvents, and to do so in a manner which does not rely on thermal effects.

It is a still further object of this invention to provide a method for etching patterns in polyimide films without modifying the bulk of the material, and without degrading or weathering the unetched portions of the polyimide film.

It is another object of this invention to provide a method for etching polyimide films by a technique which has etch rates that are much faster than previously used techniques for etching these films.

DISCLOSURE OF THE INVENTION

This invention is a method for etching polyimide, without the need for chemical solvents or heating effects. The polyimide can be in bulk or thin film form, and can be etched to any depth, including entirely through the polyimide. Polyimide films etchable by the technique of this invention include any which contain an -imide linkage, either in the backbone of the chain or in a side chain. Etching is to a depth of at least 1000 Å.

In order to etch the polyimide, it is exposed to far-UV radiation having a wavelength less than 220 nm. Any source for providing ultraviolet radiation in this wavelength range can be used, two commercially available examples being the ArF excimer laser (193 nm) and the low pressure mercury lamp (185 nm). Either pulsed or continuous light sources can be used.

There appears to be a power (intensity) dependency in order for the effect to be most significant. Experiments have shown that a minimum intensity of 60 mJ/cm$^2$ is required to produce a significant photoetching effect.

Exposure to far-UV radiation in the wavelength range less than 220 nm can cause photodecomposition of a layer of the polyimide, producing volatile products which can be extracted. In this process, bonds in the polymer chain are broken and then rebroken to yield eventually the volatile products. Exposure of the polyimide to this UV radiation can be done in air or a vacuum (with a very small etching effect), but photoetching occurs most rapidly and effectively in an atmosphere containing some oxygen.

Selected patterns can be produced in the polyimide by the use of a mask, or by scanning the UV radiation beam across the polyimide.

These and other objects, features, and advantages will be apparent from the following more particular description of the preferred embodiments.

BEST MODE FOR CARRYING OUT THE INVENTION

Figure 1:
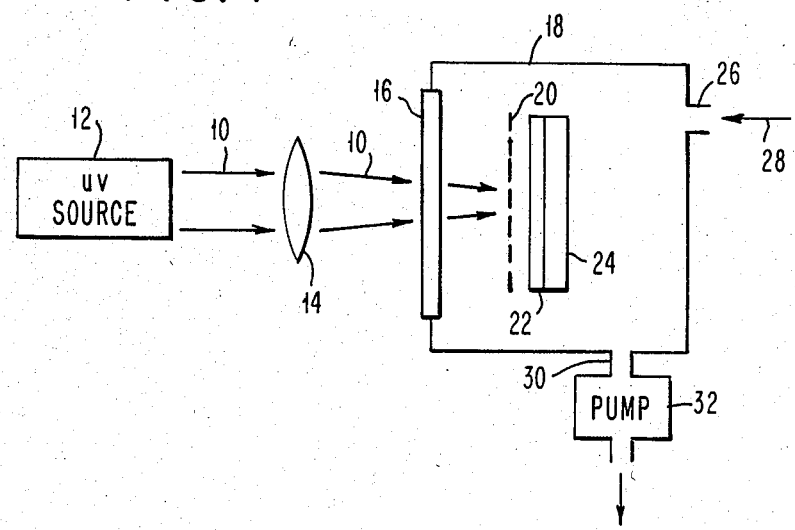
FIG. 1 is a schematic illustration of an apparatus which can be used to practice the present invention, and includes a source of UV radiation and a chamber in which the polyimide is located, there being means for controlling the atmosphere in which the photoetching occurs.

In its broadest sense, far-UV radiation of wavelengths less than 220 nm is incident on a polyimide film or bulk polyimide in order to photoetch the polyimide. Etching will occur at room temperatures or elevated temperatures, and in different atmospheres, including air and oxygen. The effect of different parameters, such as substrate, atmosphere, temperature, and UV radiation source will be described in more detail in the following examples.

For the purpose of this invention, any wavelengths less than 220 nm can be used, and the source of this radiation can provide either continuous or pulsed radiation. Two commercially available sources are the low pressure mercury resonance lamp λ=185 nm) designed for this wavelength range, and the argon fluoride excimer laser ($\lambda=193$ nm). This mercury resonance lamp is a continuous source which operates at a minimum of cost per photon of far-UV light. However, it suffers from the low surface luminosity of the discharge lamp. For example, a lamp of 39 watts input is nearly one meter long. This source is well suited for irradiation of large areas to low net reaction. A bank of 6 lamps (shown in FIG. 2) can be used to irradiate an area of 9000 cm$^2$ with 4.2 milliwatts/cm$^2$ of 185 nm radiation.

The argon fluoride excimer laser is designed for pulsed operation and, typically, 300 mJ pulses (1.5 cm$^2$ area) are available at a repetition rate of 10/sec. The intensity of the pulses is invariant over many thousands of pulses. This laser can be coupled to a standard camera with appropriate optics to provide an apparatus for the exposure of wafers or semiconductor devices coated with polyimide films to far-UV radiation projected through a mask.

the practice of this invention, any source or system (including optics for frequency multiplying or dividing) which provides wavelengths less than 220 nm is suitable for irradiation of the polyimide. This wavelength range produces high yield photoetching and has a high efficiency for polyimide chain bond breaking.

However, the amount of power (intensity) in the incident radiation is important to achieve photoetching without the need for elevated temperatures ($>100°$ C.). With the ArF laser, for example, the power achievable is such that very little temperature dependence is seen when the polyimide is etched. In general, intensities above about 60 mJ/cm$^2$ produce significant photoetching where the etch rate is quite invariant with temperature. At lower intensities, the etch rate increases with increasing temperature above about 100° C.

When a laser with high power is used, the photoetching process is non-linear, and is much faster than when low pressure Hg lamps are used. A laser is much more efficient for the amount of power input than is the Hg resonance lamp. With the Hg lamps, the photoetching process is a linear one which is far slower than that with the ArF laser.

The UV radiation breaks bonds in the polyimide chain, splitting the chain into smaller units. The smaller units continue to absorb the incident radiation and break into still smaller units until, ultimately, the small molecules that are the end products vaporize and carry away the excess energy of the photons as translational, vibrational, and rotational energy. There is little if any heating effect in the polyimide chain, the photochemical dissociation of the chain being the mechanism which causes photoetching. In this chain, the breaking of one bond is not likely to result in the splitting of the chain. Many more bond-breaks are necessary to break up the chains and to be enough to dislodge volatile molecules. However, the photochemistry occurs in the optical path of the photons and all of the material in the optical path will eventually be removed. Very little heating of the substrate or the bulk of the film occurs, and the polyimide film ablates due to the input radiation. Further, the photochemistry is limited at any instant to the depth at which the incident radiation is absorbed. The final depth of etching of the polyimide depends on the time of exposure to the radiation, at constant intensity.

The method of deposition of the polyimide (spraying, spinning, etc.) or of curing (hotplate, infrared lamp, etc.) does not affect the response of the polyimide to radiation in this wavelength range, as long as the deposited precursor material is cured to its polyimide state.

The role of oxygen in the removal process is secondary. That is, the polyimide absorbs the input UV radiation and undergoes photolysis. This process does not begin with oxygen absorbing the light photons. However, the process is accelerated by the presence of oxygen, since it is believed that oxygen seals the ends of the broken chain fragments to prevent recombination of these fragments. Thus, the oxygen allows the photolysis process to continue to produce smaller and smaller fragments until volatile species result. It is also possible that the oxygen may start a secondary process which is more facile and which additionally speeds up the etching process.

In the practice of this invention, the radiation must be less than 220 nm in wavelength. The intensity of the pulsed incident radiation must be at least 60 mJ/cm$^2$ to cause effective photoetching, and must be at least about 100 mJ/cm$^2$ to produce a clean ablative photodecomposition which does not lead to carbonaceous residues. When continuous sources are used, the intensities can be many thousand-fold lower.

Apparatus for Etching Polyimide

FIG. 1 is a schematic illustration of a suitable apparatus for carrying out this invention. Ultraviolet radiation, represented by the arrows 10, is provided by a UV radiation source 12. A lens 14 can be used to concentrate the radiation.

The radiation passes through a transparent quartz window 16 and enters the chamber 18. It passes through mask 20 and strikes polyimide layer 22, located on the substrate 24. Chamber 18 has an inlet port 26 into which different gases such as oxygen, air, etc. can be introduced, as represented by the arrow 28. Chamber 18 also has an outlet port 30, to which is attached the pump 32. Pump 32 is used to remove volatile by-products formed by photoetching the polyimide 22 and also for removing residual gases in the atmosphere within chamber 18.

The polyimide layer 22 need not be supported by a substrate 24, and can be bulk material. Substrate 24 can be a semiconductor wafer on which layer 22 is formed, or any other substrate. The time of exposure to the radiation can be any length, and can be sufficient that the polyimide layer 22 is etched completely to the substrate 24.

A suitable laser producing 193 nm output radiation is the Lambda Physik EMG 500 Pulsed Laser, filled with argon and fluorine. This laser has an output of 13 MW/CM$^2$ at 1 Hz. An iris can be used to select the central 0.5 cm circle of the beam, which can be collimated through a quartz spherical lens. The incident energy onto the polyimide can be 100-300 mJ/cm$^2$/pulse with this laser, the pulse duration being about 12 nsec.

Figure 2:
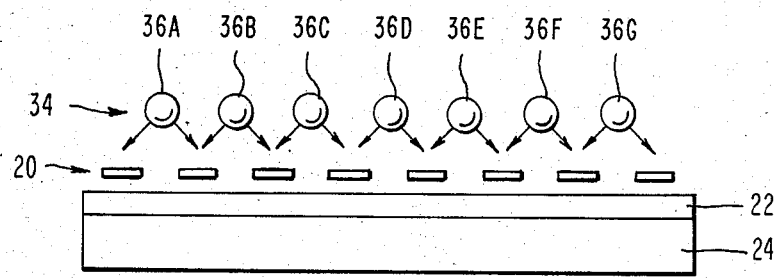
FIG. 2 is a schematic illustration of a bank of low pressure mercury resonance lamps used to photoetch polyimide.

In FIG. 2, a bank 34 of 6 low pressure mercury resonance lamps 36A, 36 . . . 36G is used to illuminate the polyimide layer. The same reference numerals are used for the mask 20, polyimide layer 22, and substrate 24 as were used in FIG. 1. The wavelength of the radiation from these lamps is 185 nm, and is continuous radiation. These lamps produce incident power which can be adjusted, a typical power being 1.6 mW/cm$^2$ at the irradiated surface.

EXAMPLES

Figure 3:
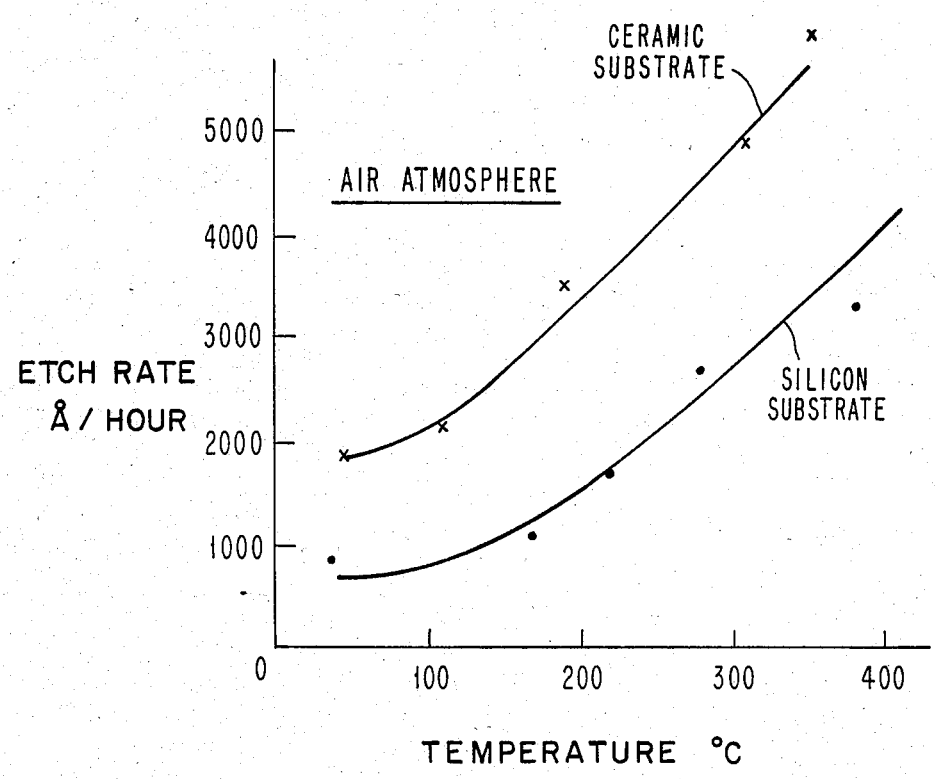
FIG. 3 is a graph of etch rate versus temperature for the photoetching of two polyimide films, one of which was on a ceramic substrate while the other was on a silicon substrate. Etching occurred in an air atmosphere, using Hg lamps (185 nm).

FIG. 3 is a plot of the etch rate in angstroms/hour as a function of temperature in °C. Two layers of polyimide were photoetched using the aforementioned 185 nm low pressure Hg lamps. The photoetching occurred in an air atmosphere, one of the polyimide layers being located on a silicon substrate while the other was located on a ceramic substrate.

As is apparent from this graph, the rate of photoetching increased with temperature when the temperature was above about 100° C. This increasing rate was noticed for both substrates, and is due to the increase in the kinetics of the oxidative photodecomposition process with temperature. The incident radiation has a small power density less than 60 mJ/cm$^2$. Since the polyimide has a very condensed structure, it is not easily etched by the radiation. However, when the temperature is raised, secondary effects appear to occur and the net etch rate increases. Even the presence of oxygen doesn't cause a high etch rate at temperatures below about 150° C. As mentioned previously, an increase in temperature had no measurable effect when higher power laser pulsed were used.

Photoetching of polyimide by far-UV excitation in a nitrogen or vacuum atmosphere was minimal. The polyimide was nearly inert to the radiation from the mercury resonance lamp and from the ArF excimer laser in these atmospheres.

For far-UV excitation in air, different effects were seen depending upon the wavelength of the source. When 185 nm Hg lamp radiation was used, very slow etching occurred, the rate increasing approximately 6 fold on heating to 200° C. This is the effect noted with respect to FIG. 3.

When the polyimide is etched in air using a 193 nm emitting laser, the etch rate was about 750 Å/pulse when 350 mJ/cm$^2$/pulse is incident on the polyimide. An increase in temperature had no measurable effect, since the laser pulse power was sufficiently high ($>$60 mJ/cm$^2$). In this situation, many bonds are broken in the polymer chain and the photoetching occurs rapidly. No evidence of polyimide and/or substrate heating appears and the polyimide is rapidly etched. Laser photoetching is a preferred technique for etching polyimides of all types.

In another example, a polyimide film 5 μm thick was subjected to three hundred 193 nm laser pulses, using a nominal energy of 0.300 J/pulse, with the laser beam focussed onto various sizes with appropriate lensing. The polyimide film was located on a silicon substrate and had a patterned chromium metallurgy on its surface. The actual dosage of radiation on the polyimide film was controlled by the number of laser pulses. The polyimide film was removed by the UV light beam, the irradiated portions of the film being completely removed from the substrate. The substrate was very clean without any polyimide residue, as confirmed by a conductivity measurement of the silicon surface. The UV radiation did not interfere with the integrity of the chromium stripe pattern.

Figure 4:
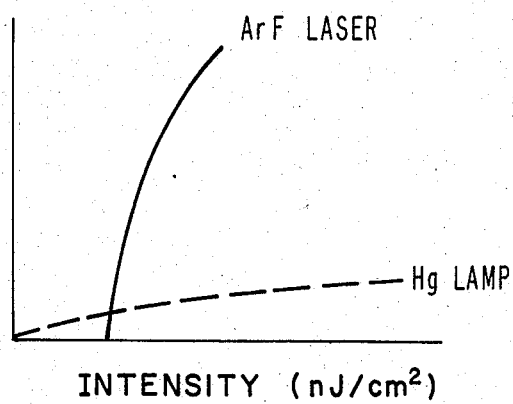
FIG. 4 is a graph of etch rate depth versus intensity that schematically represents the differences in etch rate and etch rate mechanism that occur when low pressure Hg lamps and ArF lasers are used to etch polyimide.
Figure 5:
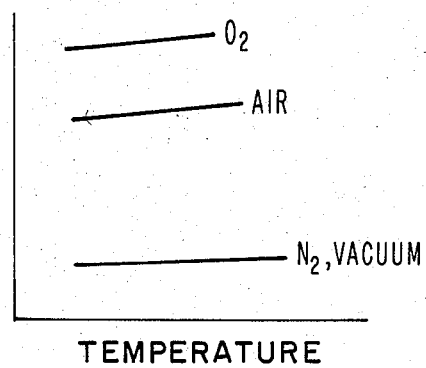
FIG. 5 is a graph of etch rate versus temperature, for different atmospheres, using an ArF laser for etching the polyimide.
Figure 6:
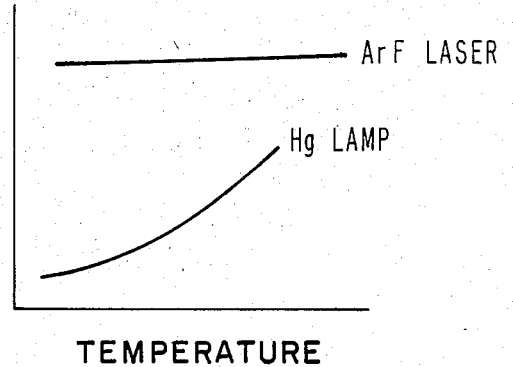
FIG. 6 is a graph of etch rate versus temperature for photoetching polyimide using an ArF laser (193 nm) and a low pressure Hg lamp (185 nm).

FIGS. 4–6 are graphs which qualitatively indicate the different effects which are seen in the photodecomposition of polyimides by far-UV radiation of wavelengths less than 220 nm.

In FIG. 4, the etch rate depth is shown versus intensity of the ultraviolet radiation, the dashed curve that is obtained when a mercury resonance lamp is used. The solid curve is that obtained when an ArF laser is used for photoetching. As is apparent, the etch rate depth starts from the origin and is substantially linear when a mercury lamp is used, since the radiation is continuous and intensity from such a lamp is below the threshold of approximately 60 mJ/cm$^2$ noted previously. On the other hand, the ArF laser produces a pulsed output, rather than a continuous output. Therefore, photoetching of polyimide will not occur until the intensity of the pulses is in excess of the threshold, which is about 60 mJ/cm$^2$. After this, the depth of etching (per pulse) increases extremely rapidly, as indicated by the curve. Since this threshold effect exists, the relationship is a nonlinear one and the photoetching depth per laser pulse increases rapidly.

FIG. 5 is an indication of the different rates of photoetching which occur as a function of temperature, for different atmospheres. This graph schematically illustrates the effect that different atmospheres have on photodecomposition for ultraviolet radiation from the aforementioned ArF excimer laser having a wavelength of 193 nm. The effect of a temperature difference is not greatly measurable when this laser is used. However, as is apparent from FIG. 5, photoetching occurs at higher etch rates in oxygen and air atmospheres than in either a nitrogen atmosphere or a vacuum. While the etch rates in nitrogen and in vacuum are indicated as being approximately the same, it appears that the etch rate in vacuum may be slightly higher than that in nitrogen, but the differences may be so small as to be unnoticeable.

FIG. 6 is a schematic illustration of the differences which occur when the pulsed ArF laser and the Hg lamp are used for photoetching the polyimide. This graph indicates etch rates as a function of temperature. As noted previously, the etch rate using this laser is substantially temperature invariant, while the etch rate using the continuous radiation of the mercury lamp increases with temperature after approximately 100° C. Etching of polyimides using continuous mercury lamp radiation is very slow until secondary effects seem to occur as the temperature is raised above about 100° C. In contrast with this, a threshold effect is noticed with the pulsed laser radiation, where etching does not occur until a minimum intensity of approximately 60 mJ/cm$^2$ per pulse is obtained. At higher intensities, the primary photodecomposition mechanism becomes even more dominant, and photoetching occurs without the need for any type of secondary effect.

In the practice of this invention, films and bulk polyimide materials of any type are exposed to UV radiation of wavelengths less than 200 nm in order to photochemically etch the polyimide to a depth in excess of about 1000 Å. This etching is more than a surface effect, and can be completely through the thickness of the polyimide. For example, films 1–3 microns thick are easily etched completely to the substrate by this technique. The depth of etching depends only upon the time of exposure for a given intensity of incident radiation, above a power density of about 60 mJ/cm$^2$. Any type of radiation source or apparatus providing radiation in this wavelength range can be used, although laser sources having power densities greater than about 60 mJ/cm$^2$ are preferred.

While the invention has been described with respect to preferred embodiments thereof, it will be appreciated by those of skill in the art that variations may be made without departing from the spirit and scope of the invention.

Having thus described our invention, what we claim as new and desire to secure by Letters Patent is:

1. A method for etching polyimides comprising photoetching said polyimide to a depth of at least 1000 Å by irradiating the polyimide with UV radiation having wavelenths less than 220 nm.

2. The method of claim 1, where said radiation is directed through a mask before striking the polyimide.

3. The method of claim 1, where said polyimide is a layer located on a substrate.

4. The method of claim 3, where said photoetching occurs until said polyimide is etched completely to said substrate.

5. The method of claim 1, where said photoetching occurs in an atmosphere including oxygen.

6. A method for etching polyimide, including the step of directing ultraviolet radiation having wavelengths less than 220 nm onto a surface of said polyimide, said radiation being produced by a laser providing output UV radiation having intensities greater than about 60 mJ/cm$^2$, said radiation etching said polyimide to a depth greater than 1000 Å.

7. The method of claim 6, where said laser is an argon fluoride laser producing an output at 193 nm wavelength.

8. The method of claim 6, where said photoetching occurs in an atmosphere containing oxygen.

9. The method of claim 6, where said UV radiation is applied to selected areas of said polyimide.

10. The method of claim 6, where said photoetching occurs in an atmosphere of air.

11. A method for etching polyimide, including the step of irradiating the surface of said polyimide with ultraviolet radiation of wavelengths less than 220 nm to photoetch said polyimide to a depth greater than 1000 Å, said photoetching occurring in an atmosphere containing oxygen.

12. The method of claim 11, where said UV radiation is produced by a laser.

13. The method of claim 11, where said UV radiation is produced by a low pressure mercury lamp.

14. The method of claim 11, where said atmosphere is air.

15. The method of claim 11, where said UV radiation is incident on selected areas of the surface of said polyimide.

16. The method of claim 11, where said polyimide is a layer located on a substrate.

17. The method of claim 16, where said polyimide layer is etched completely to said substrate.

18. The method of claim 11, where said radiation is applied as pulses.

19. The method of claim 11, where said radiation is applied continuously.

20. A method for etching polyimide, comprising the steps of directing ultraviolet radiation to selected areas of a surface of a layer of polyimide located on a substrate to photoetch said areas, said radiation being produced by a laser and having wavelengths less than 220 nm, the atmosphere in which said polyimide is located containing oxygen, and continuing the irradiation of said polyimide with said ultraviolet radiation until at least 1000 Å of said polyimide is photoetched by said radiation.

21. The method of claim 20, where said radiation has an intensity at least about 100 mJ/cm$^2$.

* * * * *